(12) United States Patent
Kim et al.

(10) Patent No.: US 12,148,381 B2
(45) Date of Patent: Nov. 19, 2024

(54) DISPLAY DEVICE

(71) Applicant: LG Display Co., Ltd., Seoul (KR)

(72) Inventors: JiAh Kim, Seoul (KR); JoungMi Choi, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/238,203

(22) Filed: Aug. 25, 2023

(65) Prior Publication Data

US 2024/0177668 A1 May 30, 2024

(30) Foreign Application Priority Data

Nov. 30, 2022 (KR) .......................... 10-2022-0164553

(51) Int. Cl.
*G09G 3/3233* (2016.01)
*H10K 59/121* (2023.01)

(52) U.S. Cl.
CPC ....... *G09G 3/3233* (2013.01); *H10K 59/1213* (2023.02); *G09G 2300/0819* (2013.01); *G09G 2300/0852* (2013.01); *G09G 2310/08* (2013.01); *G09G 2320/0626* (2013.01); *G09G 2330/021* (2013.01); *G09G 2360/144* (2013.01)

(58) Field of Classification Search
None
See application file for complete search history.

(56) References Cited

U.S. PATENT DOCUMENTS 9,633,607 B1\* 4/2017 Aubert ................ G09G 3/3406
2021/0335251 A1\* 10/2021 Liu ...................... G09G 3/3233

FOREIGN PATENT DOCUMENTS

CN 110189692 A \* 8/2019 ........... G09G 3/3208
KR 10-2007-0065676 A 6/2007

OTHER PUBLICATIONS

Translation of CN-110189692-A into English; Bai et al. (Year: 2019).\*

\* cited by examiner

*Primary Examiner* — Brian M Butcher
(74) *Attorney, Agent, or Firm* — Birch, Stewart, Kolasch & Birch, LLP

(57) ABSTRACT

A display device can include a plurality of sub pixels disposed on a substrate; a first driver disposed in each of the plurality of sub pixels, the first driver being configured to generate a first driving current for a normal mode in which an image is displayed in a luminance range equal to or lower than a predetermined luminance; a second driver disposed in each of the plurality of sub pixels, the second driver being configured to generate a second driving current for a high luminance mode in which the luminance range is higher than the predetermined luminance; and a light emitting diode. Also, the light emitting diode is configured to receive the first driving current in the normal mode, and receive a sum of the first driving current and the second driving current in the high luminance mode.

18 Claims, 12 Drawing Sheets

DISPLAY DEVICE

CROSS-REFERENCE TO RELATED APPLICATIONS

This application claims the priority to Korean Patent Application No. 10-2022-0164553 filed on Nov. 30, 2022, in the Republic of Korea, the entirety of which is incorporated herein by reference.

BACKGROUND

Field

The present disclosure relates to a display device, and more particularly, to a display device which is switchable between a normal mode and a high luminance mode.

Description of the Related Art

Among various types of display devices, which are used for a monitor of a computer, a television, a cellular phone, or the like, there are an organic light emitting display (OLED) device which is a self-emitting device (e.g., no backlight unit needed), a liquid crystal display (LCD) device which requires a separate light source (e.g., a backlight unit), and the like.

An applicable range of the display device is diversified to personal digital assistants as well as monitors of computers and televisions and a display device with a large display area and a reduced volume and weight is being studied.

In the meantime, recently, demand for display devices used outdoors or in bright lighting are increasing. For example, signage can be placed in public or commercial spaces to display various information or advertisements, and there are situations in which a lighter display device is brought to outdoor activities such as camping. However, there is a problem in that outdoor visibility deteriorates due to an increase in external light reflectance by various wires or electrodes inside the display device. To address this type of situation, outdoor visibility is improved by increasing the luminance of the display device by increasing power consumption. However, a need exists for being able to increase the luminance of the display device only when needed, while also reducing power consumption and being able to maintain good image quality for low grayscale levels.

SUMMARY OF THE DISCLOSURE

An object to be achieved by the present disclosure is to provide a display device with an improved outdoor visibility.

Another object to be achieved by the present disclosure is to provide a display device which implements a high luminance.

Still another object to be achieved by the present invention is to provide a display device which easily expresses a low grayscale level while implementing a high luminance.

Still another object to be achieved by the present disclosure is to provide a display device which improves the luminance without increasing an output range of a data voltage.

Still another object to be achieved by the present disclosure is to provide a display device which is driven in a high luminance mode only in a bright external environment to be driven with a low power.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device is a display device which is driven in any one of a normal mode in which an image in a luminance range which is equal to or lower than a predetermined luminance is displayed and a high luminance mode in which an image in a luminance range higher than the predetermined luminance. The display device includes a substrate in which a plurality of sub pixels is disposed: a first driver which is disposed in each of the plurality of sub pixels and is configured to generate a first driving current: a second driver which is disposed in each of the plurality of sub pixels and is configured to generate a second driving current: a light emitting diode which is supplied with the first driving current and the second driving current, and in the normal mode, the first driving current is supplied to the light emitting diode and in the high luminance mode, the first driving current and the second driving current are supplied to the light emitting diode together. Accordingly, the second driver is selectively driven only in the high luminance mode, in order to save power consumption while displaying a high luminance image.

Other detailed matters of the example embodiments are included in the detailed description and the drawings.

According to the present disclosure, the luminance of the display device is improved to improve the outdoor visibility.

According to the present disclosure, the luminance of the display device can be selectively improved to selectively adjusted.

According to the present disclosure, the image quality degradation of a low grayscale image can be minimized.

According to the present disclosure, the luminance of the display device can be improved without increasing an output range of the data voltage.

According to the present disclosure, the display device is driven selectively in a high luminance mode if necessary to reduce the power consumption and drive the display device with low power.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
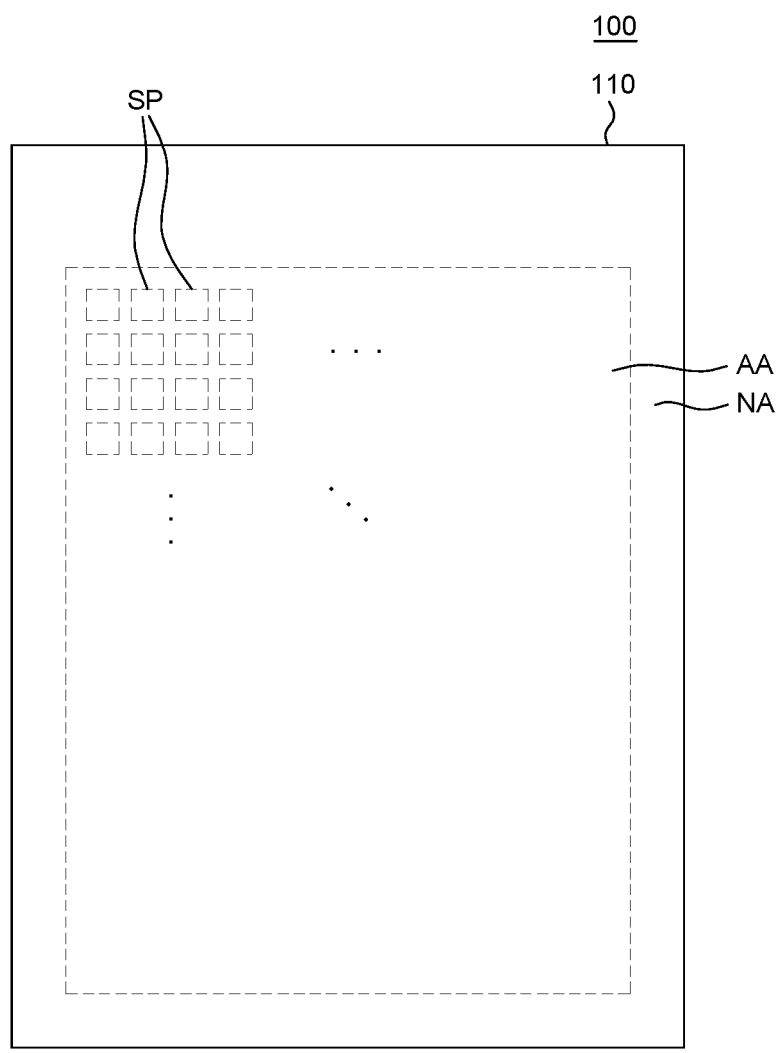
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," etc. used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly."

When an element or layer is disposed "on" another element or layer, another layer or another element can be interposed directly on the other element or therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

FIG. 1 is a plan view of a display device according to an example embodiment of the present disclosure. In FIG. 1, for the convenience of description, among various components of the display device 100, only a substrate 110 and a plurality of sub pixels SP are illustrated.

The substrate 110 is a component for supporting various components included in the display device 100 and can be formed of an insulating material. For example, the substrate 110 can be formed of glass, resin, or the like. Further, the substrate 110 can be configured to include polymer or plastics or can be formed of a material having flexibility.

The substrate 110 includes an active area AA and a non-active area NA.

The active area AA is an area where a plurality of sub pixels SP is disposed to display images. Each of the plurality of sub pixels SP is an individual unit which emits light and in each of the plurality of sub pixels SP, a light emitting diode and a driving circuit can be formed. The light emitting diode can vary depending on a type of the display device 100. For example, when the display device 100 is an organic light emitting display device, the light emitting diode can be an organic light emitting diode which includes an anode, an organic layer, and a cathode. In addition to this, as the light emitting diode, a micro light emitting diode (LED), a quantum-dot light emitting diode (QLED) including quantum dots (QD), or the like can be further used.

The non-active area NA is an area where no image is displayed and various wiring lines, driving integrated circuits (ICs), and the like for driving the sub pixels SP disposed in the active area AA are disposed. For example, in the non-active area NA, various ICs such as a gate driver IC and a data driver IC and driving circuits can be disposed. In the meantime, the non-active area NA can be located on a rear surface of the substrate 110, that is, a surface on which the sub pixels SP are not disposed or can be omitted, and is not limited as illustrated in the drawing.

Hereinafter, a plurality of sub pixels SP will be described in more detail with reference to FIGS. 2 and 3.

Figure 2:
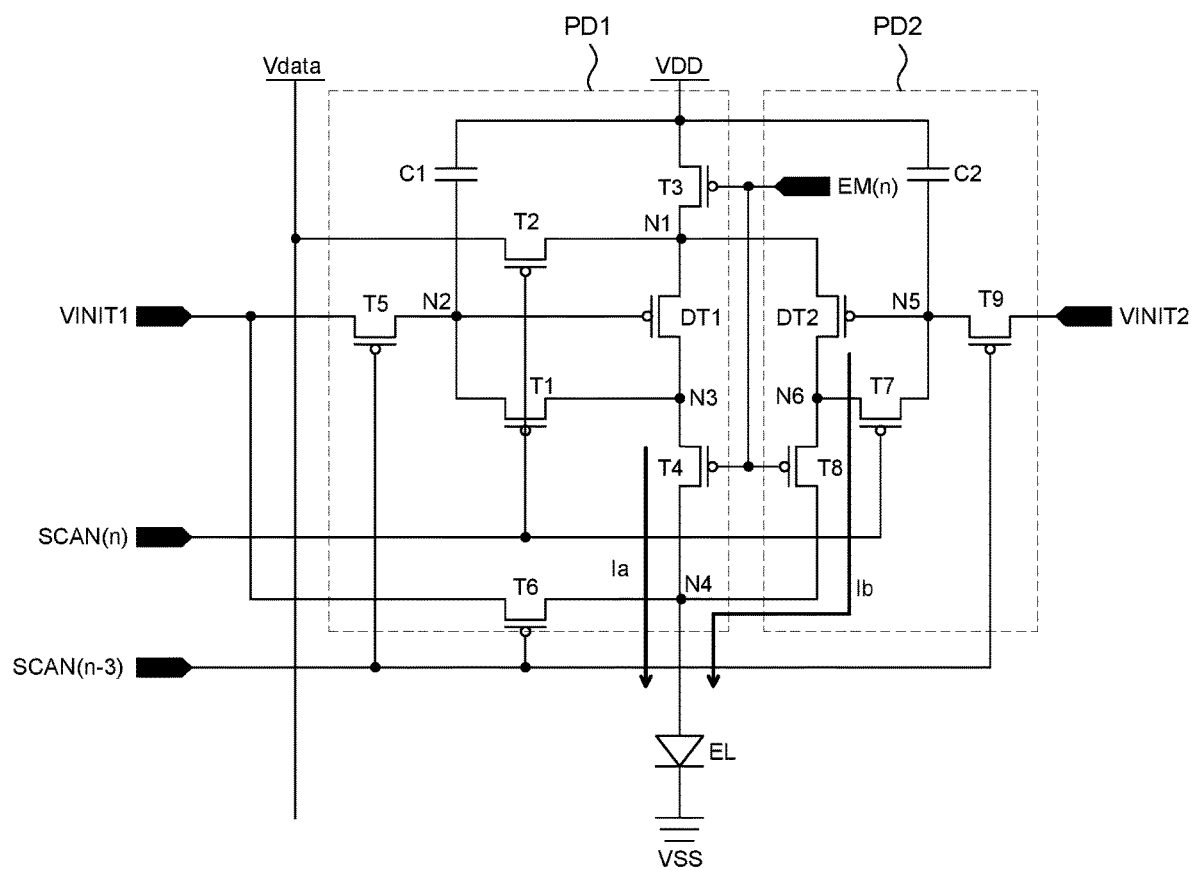
FIG. 2 is a circuit diagram of a sub pixel of a display device according to an example embodiment of the present disclosure.

FIG. 2 is a circuit diagram of a sub pixel of a display device according to an example embodiment of the present disclosure. FIG. 3 is a driving timing diagram of a sub pixel of a display device according to an example embodiment of the present disclosure. FIG. 2 is a circuit diagram of a sub pixel SP disposed in an n-th row among a plurality of sub pixels SP.

First, the display device 100 according to the example embodiment of the present disclosure can be driven in any one of a normal mode and a high luminance mode. When an image with a luminance range which is equal to or lower than a predetermined luminance from a black image is displayed, the display device is driven in a normal mode and when an image with a luminance range which is higher than the predetermined luminance is displayed, the display device can be driven in a high luminance mode.

The normal mode is mainly used when an external environment of the display device 100 is not bright. When an ambient level of light around the display device 100 being less than a predetermined light level, the display device 100 is driven in the normal mode. For example, when the display device 100 is used in the indoor environment or is used in a night environment, even though the screen is not displayed with a high luminance, the screen can be easily recognizable to the user.

The high luminance mode is used when an external environment of the display device 100 is very bright. When an ambient level of light around the display device 100 being greater than the predetermined light level, the display device 100 is driven in the high luminance mode. For example, when the display device 100 is used in the outdoors at noon in bright sunlight or in a bright room, the external light is reflected from the display device 100 and the visibility is degraded. Therefore, the display device 100 is driven in the high luminance mode to display more light than external light reflected from the display device 100 and the outdoor visibility can be improved. In this situation, the visibility of the display device 100 in the outdoors is improved so that the display device 100 can be used for outdoor activities, such as camping or in more places, such as outdoor billboards and other signage.

Accordingly, the display device 100 is driven in a high luminance mode only when the outdoor visibility is degraded or when high luminance is desired, and in other situations, the display device 100 is driven in a normal mode to save the power consumption and drive the display device 100 with low power.

Therefore, the display device 100 according to the example embodiment of the present disclosure connects a second driving transistor DT2 to a first driving transistor DT1 in parallel in each of the plurality of sub pixels SP to be driven in any one of a normal mode and a high luminance mode. In a normal mode in which an image is displayed in a luminance range that is equal to or lower than a predetermined luminance, the first driver PD1 is turned on to generate a first driving current Ia and the second driver PD2 is turned off so that a second driving current Ib is not generated, and power consumption is reduced. In contrast, in a high luminance mode in which an image is displayed in a luminance range that is higher than a predetermined luminance, the first driver PD1 is turned on to generate the first driving current Ia and the second driver PD2 is also turned on to generate the second driving current Ib which combine to provide more current to display a brighter image.

Referring to FIG. 2, each of the plurality of sub pixels SP includes a light emitting diode EL, a first driver PD1 and a second driver PD2 to supply a driving current to the light emitting diode EL. In a normal mode, only the first driver PD1 is driven and in the high luminance mode, both the first driver PD1 and the second driver PD2 can be driven. In the normal mode, only one first driver PD1 is driven to supply the first driving current Ia to the light emitting diode EL and in the high luminance mode, both the first driver PD1 and the second driver PD2 are driven to supply the first driving current Ia and the second driving current Ib to the light emitting diode EL. Accordingly, in the high luminance mode, a high current obtained by adding the first driving current Ia and the second driving current Ib is supplied to the light emitting diode EL to display a high luminance image and improve the outdoor visibility. In other words, according to an embodiment, an extra driver circuit (e.g., DT2, T7, T8, T9 and C2) is provided in each subpixel circuit, which is only activated during the high luminance mode, in order to display brighter image. For example, second driver PD2 can also be referred to as a type of booster circuit, since it increases the amount of current provided to the light emitting diode EL.

The first driver PD1 of each of the plurality of sub pixels SP includes a first transistor T1, a second transistor T2, a third transistor T3, a fourth transistor T4, a fifth transistor T5, a sixth transistor T6, a first driving transistor DT1, and a first capacitor C1. The second driver PD2 includes a seventh transistor T7, an eighth transistor T8, a ninth transistor T9, a second driving transistor DT2, and a second capacitor C2.

Each of the plurality of sub pixels SP is connected to a plurality of scan lines, a data line, an emission control line, a first initialization line, a second initialization line, a high potential power line, and a low potential power line.

In the meantime, the plurality of transistors of the plurality of sub pixels SP can be formed by different types of transistors. For example, one transistor among the plurality of transistors can be a transistor having an oxide semiconductor as an active layer. The oxide semiconductor material has a low off-current so that the oxide semiconductor material is appropriate for a switching transistor which maintains a short turn-on time and a long turn-off time.

As another example, the other transistor among the plurality of transistors can be a transistor having low temperature poly-silicon (LTPS) as an active layer. The poly-silicon material has a high mobility to have a low power consumption and excellent reliability so that it is appropriate for the driving transistor.

In the meantime, the plurality of transistors can be N-type transistors or P-type transistors. In the N-type transistor, carriers are electrons so that electrons can flow from a source electrode to a drain electrode and currents can flow from the drain electrode to the source electrode. In the P-type transistor, carriers are holes so that holes can flow from a source electrode to a drain electrode and currents can flow from the source electrode to the drain electrode. For example, one of the plurality of transistors can be an N-type transistor and the other one of the plurality of transistors can be a P-type transistor.

Hereinafter, it is assumed that the plurality of transistors included in the first driver PD1 and the second driver PD2 are P-type transistors, but is not limited thereto.

First, the first transistor T1 of the first driver PD1 includes a gate electrode, a source electrode, and a drain electrode. The gate electrode of the first transistor T1 is connected to an n-th scan line disposed in an n-th row and the source electrode and the drain electrode are connected to a second node N2 and a third node N3. The first transistor T1 is turned on by a scan signal SCAN(n) of the n-th scan line to electrically connect the second node N2 and the third node N3. Therefore, the first driving transistor DT1 can be diode-connected by the turned-on first transistor T1 and sense a threshold voltage of the first driving transistor DT1.

The second transistor T2 includes a gate electrode, a source electrode, and a drain electrode. The gate electrode of the second transistor T2 is connected to an n-th scan line, the source electrode is connected to the data line, and the drain electrode is connected to the first node N1. The second transistor T2 is turned on by a scan signal SCAN(n) of the n-th scan line to transmit a data voltage Vdata of the data line to the first node N1.

The third transistor T3 includes a gate electrode, a source electrode, and a drain electrode. The gate electrode of the third transistor T3 is connected to the emission control line, the source electrode is connected to the high potential power line, and the drain electrode is connected to the first node N1. The third transistor T3 is turned on by an emission control signal EM(n) of the emission control line to transmit a high potential power voltage VDD to the first node N1.

The fourth transistor T4 includes a gate electrode, a source electrode, and a drain electrode. The gate electrode of the fourth transistor T4 is connected to the emission control line, the source electrode is connected to the third node N3, and the drain electrode is connected to the fourth node N4. The fourth transistor T4 is turned on by the emission control signal EM(n) of the emission control line to electrically connect the third node N3 and the fourth node N4 and transmit the first driving current Ia to the light emitting diode EL. Also, the gates of the fourth transistor T4, the eighth transistor T8 and the third transistor T3 can all be tied together and connected to the emission control line for receiving the emission control signal EM(n).

The fifth transistor T5 includes a gate electrode, a source electrode, and a drain electrode. The gate electrode of the fifth transistor T5 is connected to an n–3-th scan line disposed in an n–3-th row, the source electrode is connected to a first initialization line, and the drain electrode is connected to the second node N2. The fifth transistor T5 is turned on by the scan signal SCAN(n–3) of the n–3-th scan line to transmit a first initialization voltage VINIT1 of the first initialization line to the second node N2.

The sixth transistor T6 includes a gate electrode, a source electrode, and a drain electrode. The gate electrode of the sixth transistor T6 is connected to an n–3-th scan line, the source electrode is connected to the first initialization line, and the drain electrode is connected to the fourth node N4. The sixth transistor T6 is turned on by the scan signal SCAN(n–3) of the n–3-th scan line to transmit the first initialization voltage VINIT1 to the fourth node N4.

The first driving transistor DT1 includes a gate electrode, a source electrode, and a drain electrode. The gate electrode of the first driving transistor DT1 is connected to a second node N2, the source electrode is connected to the first node N1, and the drain electrode is connected to the third node N3. The first driving transistor DT1 can control the first driving current Ia applied to the light emitting diode EL in accordance with the gate-source voltage Vgs.

The first capacitor C1 includes a plurality of capacitor electrodes. Some capacitor electrodes are connected to a high potential power line and the other capacitor electrodes can be electrically connected to the second node N2 which is the gate electrode of the first driving transistor DT1. In the first capacitor C1, a data voltage Vdata to which the threshold voltage of the first driving transistor DT1 is reflected is charged to constantly maintain a voltage of the gate electrode of the first driving transistor DT1 for one frame.

Next, the seventh transistor T7 of the second driver PD2 includes a gate electrode, a source electrode, and a drain electrode. The gate electrode of the seventh transistor T7 is connected to an n-th scan line, and the source electrode and the drain electrode are connected to the fifth node N5 and the sixth node N6. The seventh transistor T7 is turned on by the scan signal SCAN(n) to electrically connect the fifth node N5 and the sixth node N6. Therefore, the second driving transistor DT2 can be diode-connected by the turned-on seventh transistor T7 and sense a threshold voltage of the second driving transistor DT2.

The eighth transistor T8 includes a gate electrode, a source electrode, and a drain electrode. The gate electrode of the eighth transistor T8 is connected to the emission control line, the source electrode is connected to the sixth node N6, and the drain electrode is connected to the fourth node N4. The eighth transistor T8 is turned on by the emission control signal EM(n) to transmit the second driving current Ib from the second driving transistor DT2 to the light emitting diode EL.

The ninth transistor T9 includes a gate electrode, a source electrode, and a drain electrode. The gate electrode of the ninth transistor T9 is connected to an n–3-th scan line, the source electrode is connected to the second initialization line, and the drain electrode is connected to the fifth node N5. The ninth transistor T9 is turned on by the scan signal SCAN(n–3) of the n–3-th scan line to transmit a second initialization voltage VINIT2 from the second initialization line to the gate electrode of the second driving transistor DT2.

The second driving transistor DT2 includes a gate electrode, a source electrode, and a drain electrode. The gate electrode of the second driving transistor DT2 is connected to the fifth node N5, the source electrode is connected to the first node N1, and the drain electrode is connected to the sixth node N6. The second driving transistor DT2 can control the second driving current Ib applied to the light emitting diode EL in accordance with the gate-source voltage Vgs.

The second capacitor C2 includes a plurality of capacitor electrodes. Some capacitor electrodes are connected to a high potential power line and the other capacitor electrodes are electrically connected to the fifth node N5 which is the gate electrode of the second driving transistor DT2. In the second capacitor C2, a data voltage Vdata to which the threshold voltage of the second driving transistor DT2 is reflected is charged to constantly maintain a voltage of the gate electrode of the second driving transistor DT2 for one frame.

The light emitting diode EL includes an anode and a cathode. The anode is connected to the fourth node N4 and the cathode is connected to the low potential power line. Accordingly, the light emitting diode EL can emit light based on a driving current which is transmitted from the first driving transistor DT1 and the second driving transistor DT2 to the anode.

Figure 3:
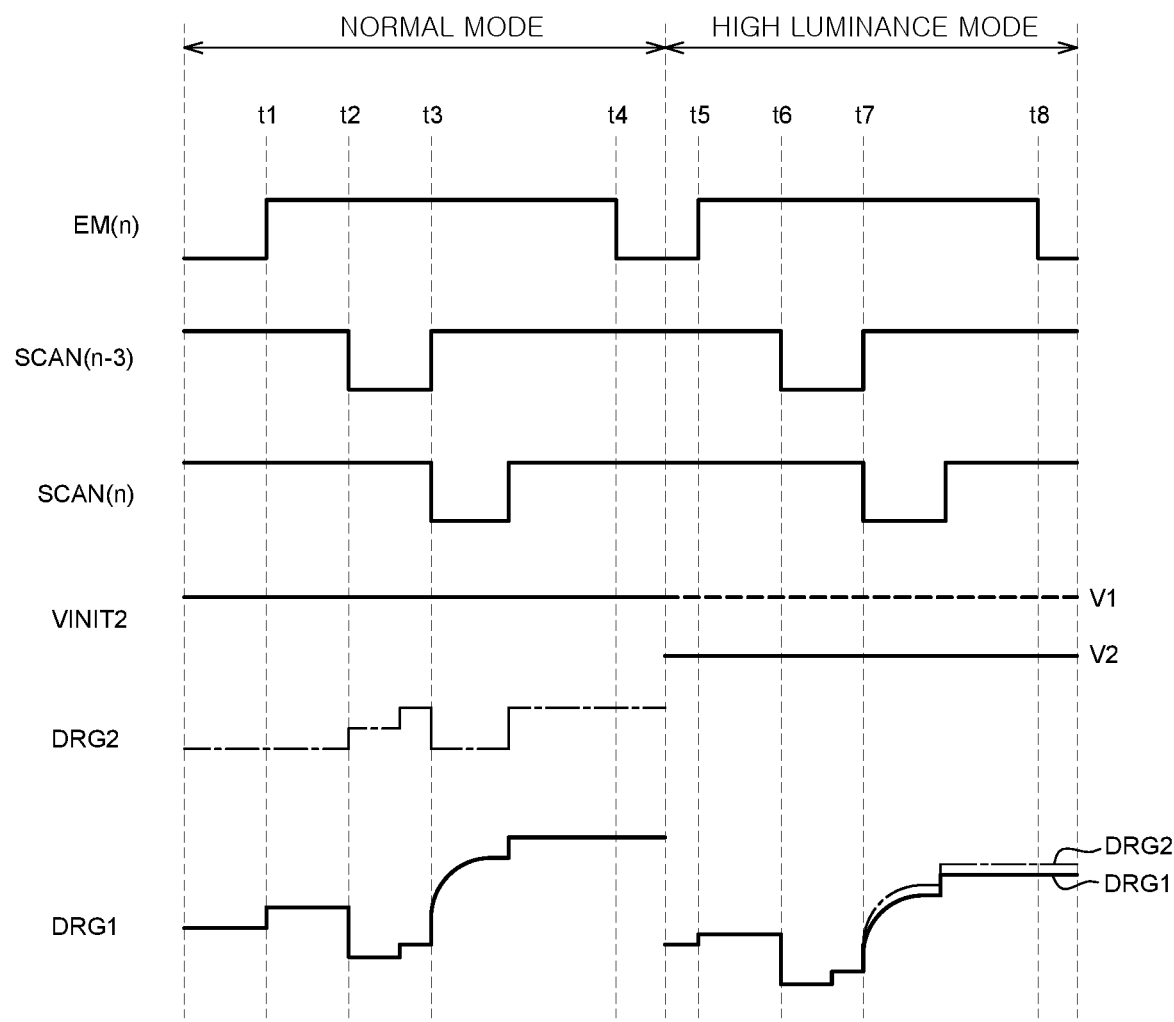
FIG. 3 is a driving timing diagram of a sub pixel of a display device according to an example embodiment of the present disclosure.

Referring to FIG. 3, during the normal-mode driving, only the first driver PD1 is driven, but the second driver PD2 is not driven (e.g., in the normal-mode driving, PD1 is on and PD2 is off). In the normal mode, only the first driving current Ia can be supplied from the first driver PD1 to the light emitting diode EL.

First, at a first time t1, a high level of emission control signal EM(n) is output to the emission control line. In this situation, the third transistor T3, the fourth transistor T4, and the eighth transistor T8 are turned off.

Next, at a second time t2, a low level of scan signal SCAN(n–3) is output to the n–3-th scan line. The fifth transistor T5, the sixth transistor T6, and the ninth transistor T9 can be turned on by the scan signal SCAN(n–3) of the n–3-th scan line. The turned-on fifth transistor T5 can transmit the first initialization voltage VINIT1 to the second node N2 which is the gate electrode DRG1 of the first driving transistor DT1. The turned-on sixth transistor T6 can transmit the first initialization voltage VINIT1 to the fourth node N4. The ninth transistor T9 can transmit the second initialization voltage VINIT2 from the second initialization line to the fifth node N5 which is the gate electrode DRG2 of the second driving transistor DT2.

At this time, the second initialization voltage VINIT2 output in the normal mode can be a first voltage V1. In the normal mode, the first voltage V1 is output to suppress the driving of the second driving transistor DT2 of the second driver PD2. The first voltage V1 can be a turn-off level voltage which turns off the second driving transistor DT2 in the normal mode. For example, the first voltage V1 can be a high level of voltage which is the same as the high potential power voltage VDD. When the first voltage V1 is applied to the gate electrode DRG2 of the second driving transistor DT2 at the second time T2, the sampling of the threshold voltage of the second driving transistor DT2 which is performed at a third time t3 is not possible and the driving of the second driving transistor DT2 can be suppressed.

Next, at a third time t3, a low level of scan signal SCAN(n) is output to the n-th scan line. The first transistor T1, the second transistor T2, and the seventh transistor T7 can be turned on by the low level of scan signal SCAN(n). The turned-on first transistor T1 electrically connects the gate electrode DRG1 and the drain electrode of the first driving transistor DT1 and the second transistor T2 can transmit the data voltage Vdata to the first node N1. Therefore, the current flows from the source electrode to the drain electrode of the first driving transistor DT1 in a diode-connection state and the voltage of the gate electrode DRG1 of the first driving transistor DT1 can rise from the first initialization voltage VINIT1 to a voltage (Vdata−Vth) obtained by subtracting the threshold voltage of the first driving transistor DT1 from the data voltage Vdata. Accordingly, in the first capacitor C1, a difference voltage (VDD−(Vdata−Vth)) of the high potential power voltage VDD and the voltage of the gate electrode DRG1 of the first driving transistor DT1 can be charged.

The seventh transistor T7 which is turned on at the third time t3 can electrically connect the gate electrode DRG2 and the drain electrode of the second driving transistor DT2. However, a first voltage V1 which is charged in the gate electrode DRG2 of the second driving transistor DT2 is already higher than the data voltage Vdata, for example, is the same level as the high potential power voltage VDD so that the P-type second driving transistor DT2 can be turned off. Further, because the voltage of the gate electrode DRG2 of the second driving transistor DT2 is the first voltage V1 which is higher than the data voltage Vdata, the threshold voltage of the second driving transistor DT2 cannot be sampled. Further, the high potential power voltage VDD is applied to one end of the second capacitor C2 and the first voltage V1, that is, the same level of voltage as the high potential power voltage VDD, is applied to the fifth node N5 of the other end of the second capacitor C2. Therefore, in this state, in the second capacitor C2, a voltage (VDD−(Vdata−Vth)) obtained by subtracting the data voltage Vdata from the high potential power voltage VDD and adding the threshold voltage cannot be stored, as stored in the first capacitor C1.

Next, at a fourth time t4, a low level of emission control signal EM(n) is output to the emission control line so that the third transistor T3, the fourth transistor T4, and the eighth transistor T8 are turned on and the first driving current Ia can be supplied to the light emitting diode EL. The turned-on third transistor T3 transmits the high potential power voltage VDD to the first node N1 and the turned-on fourth transistor T4 forms a current path between the third node N3 and the fourth node N4 to transmit the first driving current Ia from the first driving transistor DT1 to the light emitting diode EL. However, even though the eighth transistor T8 is turned on, the P-type second driving transistor DT2 is applied with the first voltage V1 which is a positive voltage through the gate electrode DRG2 to be turned off so that the second driving current Ib from the second driving transistor DT2 may not be transmitted to the light emitting diode EL.

Accordingly, during the normal mode driving, the first voltage V1 which is a turn-off level of voltage is output to turn off the second driving transistor DT2 and the second driving current Ib from the second driver PD2 may not be output (e.g., only the first current Ia is supplied to the light emitting diode EL).

Next, during the high luminance mode driving, both of the first driver PD1 and the second driver PD2 can be driven at the same time. In the high luminance mode, both the first driving current Ia from the first driver PD1 and the second driving current Ib from the second driver PD2 can be supplied to the light emitting diode EL (e.g., the light emitting diode EL receives Ia+Ib).

In the high luminance mode, the high luminance mode is substantially the same as the normal mode, except for that the second voltage V2 is applied to the second initialization line.

First, at a fifth time t5, the high level of emission control signal EM(n) is applied to turn off the third transistor T3, the fourth transistor T4, and the eighth transistor T8.

Next, at a sixth time t6, a low level of scan signal SCAN(n−3) is output to the n−3-th scan line to turn on the fifth transistor T5, the sixth transistor T6, and the ninth transistor T9. Therefore, the fifth transistor T5 and the sixth transistor T6 which are turned on can initialize the voltages of the second node N2 and the fourth node N4 to the first initialization voltage VINIT1. The turned-on ninth transistor T9 can transmit the second initialization voltage VINIT2 to the fifth node N5 which is the gate electrode DRG2 of the second driving transistor DT2.

At this time, the second initialization voltage VINIT2 output in the high luminance mode can be the second voltage V2. The second voltage V2 is a voltage output from the second initialization line at the driving of the high luminance mode, and for example, can be substantially the same voltage as the first initialization voltage VINIT1. In the high luminance mode, the second voltage V2 is output to initialize the voltage of the gate electrode DRG2 of the second driving transistor DT2 of the second driver PD2 to the same voltage as the first initialization voltage VINIT1. The second voltage V2 is applied to the gate electrode DRG2 of the second driving transistor DT2 at a sixth time t6 to perform the sampling of the threshold voltage of the second driving transistor DT2 to be performed at a seventh time t7.

Next, at the seventh time t7, a low level of scan signal SCAN(n) is output to the n-th scan line to turn on the first transistor T1, the second transistor T2, and the seventh transistor T7. The turned-on first transistor T1 can electrically connect the gate electrode DRG1 and the drain electrode of the first driving transistor DT1 and the second transistor T2 can transmit the data voltage Vdata to the first node N1. Therefore, the current flows from the source electrode to the drain electrode of the first driving transistor DT1 in a diode-connection state and the voltage of the gate electrode DRG1 of the first driving transistor DT1 can rise to a voltage (Vdata−Vth) obtained by subtracting the threshold voltage of the first driving transistor DT1 from the data voltage Vdata. Accordingly, in the first capacitor C1, a difference voltage (VDD−(Vdata−Vth)) of the high potential power voltage VDD and the voltage of the gate electrode DRG1 of the first driving transistor DT1 can be charged.

The seventh transistor T7 which is turned on at the third time t3 can electrically connect the gate electrode DRG2 and the drain electrode of the second driving transistor DT2. The current flows from the source electrode to the drain electrode of the second driving transistor DT2 which is diode-connected by the seventh transistor T7. Further, the voltage of the gate electrode DRG2 of the second driving transistor DT2 can rise from the second voltage V2 to a voltage (Vdata−Vth) obtained by subtracting the threshold voltage of the second driving transistor DT2 from the data voltage Vdata. Accordingly, in the second capacitor C2, a difference voltage (VDD−(Vdata−Vth)) of the high potential power voltage VDD and the voltage of the gate electrode DRG2 of the second driving transistor DT2 can be charged.

Next, at an eighth time t8, a low level of emission control signal EM(n) is output to the emission control line so that the third transistor T3, the fourth transistor T4, and the eighth transistor T8 are turned on and the driving current can be supplied to the light emitting diode EL. The turned-on third transistor T3 transmits the high potential power voltage VDD to the first node N1 and the turned-on fourth transistor T4 forms a current path between the third node N3 and the fourth node N4 to transmit the first driving current Ia from the first driving transistor DT1 to the light emitting diode EL. The turned-on eighth transistor T8 forms a current path between the sixth node N6 and the fourth node N4 to transmit the second driving current Ib from the second driving transistor DT2 to the light emitting diode EL.

Accordingly, during the high luminance mode driving, the second voltage V2 which is the same voltage as the first initialization voltage VINIT1 to the second initialization line to normally initialize the voltage of the gate electrode DRG2 of the second driving transistor DT2. Further, the threshold voltage can be sampled and the second driving current Ib can be output from the second driver PD2. Therefore, the first driving current Ia and the second driving current Ib are both supplied to the light emitting diode EL at the same time, that is, a high current (e.g., Ia+Ib) is supplied to the light emitting diode EL to emit light with a high luminance. In this way, visibility can be improved, even in bright conditions, such as being outside in bright sunlight.

Even though in the present disclosure, it has been described that the second driving transistor DT2 is connected to the first driver PD1 with a 7T1C structure in parallel, the first driver PD1 can be configured in various structures, such as 6T1C or 8T1C, but it is not limited thereto.

Accordingly, in the display device 100 according to the example embodiment of the present disclosure, the second driver PD2 is selectively driven to drive the display device 100 in a normal mode or a high luminance mode. In the normal mode, only the first driver PD1 is driven to supply the first driving current Ia to the light emitting diode EL. In the high luminance mode, both the first driver PD1 and the second driver PD2 are driven to supply a high current to the light emitting diode EL. At this time, the second initialization voltage VINIT2 which is applied to the gate electrode DRG2 of the second driving transistor DT2 of the second driver PD2 is configured to be the same voltage as the high potential power voltage VDD or the first initialization voltage VINIT1 to turn on or turn off the second driving transistor DT2. For example, in the normal mode, the first voltage V1 which is the same as the high potential power voltage VDD is output as the second initialization voltage VINIT2 to maintain a turned-off state of the second driving transistor DT2. In the high luminance mode, the second voltage V2 which is the same as the first initialization voltage VINIT1 is output as the second initialization voltage VINIT2 to turn on the second driving transistor DT2 to generate the second driving current Ib. Accordingly, the display device 100 according to the example embodiment of the present disclosure is temporarily driven in a high luminance mode only when it is necessary or desired, and is usually driven in a normal mode to save the power consumption.

In the meantime, in the display device 100 according to the example embodiment of the present disclosure, a ratio of a width/length of a channel of the second driving transistor DT2 is controlled or specifically configured, in order to control a performance of the high luminance mode. Hereinafter, the change in the second driving current Ib according to the ratio of the width/length of the channel of the second driving transistor DT2 will be described with reference to FIGS. 4A to 6.

Figure 4A:
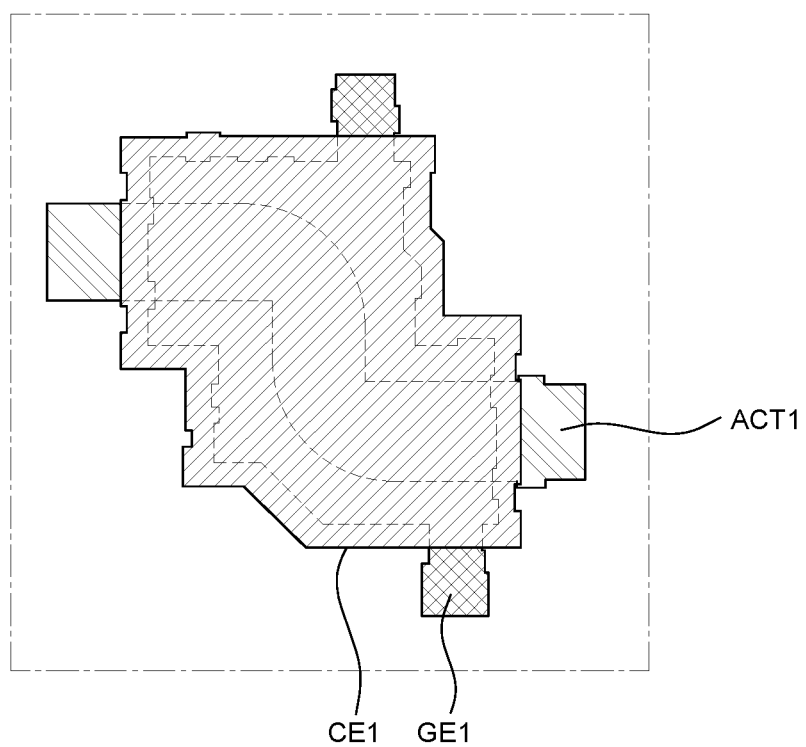
FIG. 4A is a plan view of a first driving transistor of a display device according to an example embodiment of the present disclosure.
Figure 5:
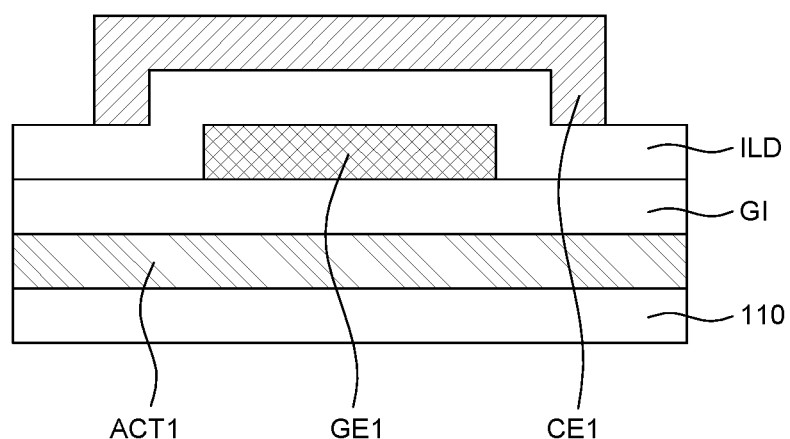
FIG. 5 is a schematic cross-sectional view of a first driving transistor of a display device according to an example embodiment of the present disclosure.
Figure 6:
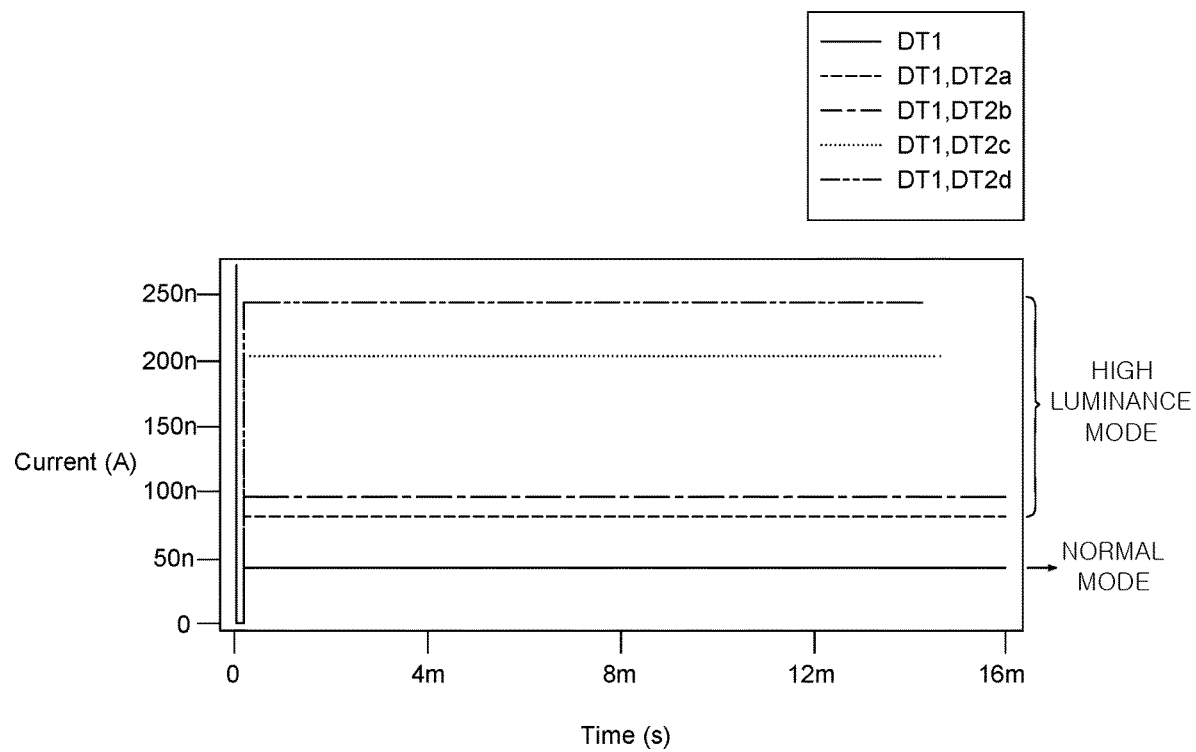
FIG. 6 is a simulation result of a driving current supplied to a light emitting diode in a display device according to various example embodiments of the present disclosure.

FIG. 4A is a plan view of a first driving transistor of a display device according to an example embodiment of the present disclosure. FIGS. 4B to 4E are plan views of a second driving transistor of a display device according to various example embodiments of the present disclosure. FIG. 5 is a schematic cross-sectional view of a first driving transistor of a display device according to an example embodiment of the present disclosure. FIG. 6 is a simulation result of a driving current supplied to a light emitting diode in a display device according to various example embodiments of the present disclosure. Specifically, FIG. 6 is a graph for explaining the change of the driving current according to the change in the ratio of the width/length of the channel of the second driving transistor DT2. For the convenience of description, in FIGS. 4A to 4E, only an active layer and a gate electrode of the first driving transistor DT1 and the second driving transistor DT2 and the capacitor electrode are illustrated.

First, as the ratio of the width of the channel of the second driving transistor DT2 to the length of the channel of the second driving transistor DT2 is increased, the second driving current Ib is increased to increase the overall driving current supplied to the light emitting diode EL. The driving current supplied to the light emitting diode EL is a sum of the first driving current Ia and the second driving current Ib so that as the second driving current Ib is increased, the driving current supplied to the light emitting diode EL can also be increased.

A ratio of the width/length of the channel represents a ratio of the width and the length of the channel formed in the active layer. An area of the active layer which overlaps with the gate electrode is a channel. Therefore, a width of the channel corresponds to a width of the gate electrode and a length of the channel corresponds to a length of a portion of the gate electrode overlapping with the active layer in a direction from the source electrode to the drain electrode. Accordingly, the ratio of the width/length of the channel can be determined by the active layer and the gate electrode. As the width of the channel is increased or the length of the channel is decreased, the resistance is reduced so that the current can more easily flow. For example, when the channel is short and wide, more current can flow. In contrast, as the width of the channel is reduced or the length of the channel is increased, the resistance is increased so that it is difficult for the current to flow. For example, with the channel is long and narrow, current is restricted and less current flows. Therefore, when the width/length ratio value is increased, more current can easily flow through the channel.

Referring to FIGS. 4A and 5, the first driving transistor DT1 includes the first active layer ACT1 and the first gate electrode GE1 and the first capacitor electrode CE1 is disposed on the first gate electrode GE1. The channel of the first driving transistor DT1 has a ratio of width/length of 4.5/21 (e.g., a ratio of 4.5 to 21).

First, the first active layer ACT1 is disposed on the substrate 110. The first active layer ACT1 can be formed of a semiconductor material, such as an oxide semiconductor, amorphous silicon, or polysilicon, but is not limited thereto.

The gate insulating layer GI is disposed on the first active layer ACT1. The gate insulating layer GI is an insulating layer which insulates the first active layer ACT1 from the first gate electrode GE1 and can be configured by a single layer or a double layer of silicon oxide (SiOx) or silicon nitride (SiNx), but is not limited thereto.

The first gate electrode GE1 is disposed on the gate insulating layer GI. The first gate electrode GE1 can be configured by a conductive material, such as copper (Cu), aluminum (Al), molybdenum (Mo), nickel (Ni), titanium (Ti), chrome (Cr), or an alloy thereof, but is not limited thereto.

The interlayer insulating layer ILD is disposed on the first gate electrode GE1. Also, a contact hole can be formed in the interlayer insulating layer ILD to allow the source electrode and the drain electrode to be connected to the active layer. The interlayer insulating layer ILD is an insulating layer which protects components below the interlayer insulating layer ILD and can be configured by a single layer or a double layer of silicon oxide SiOx or silicon nitride SiNx, but is not limited thereto.

The first capacitor electrode CE1 is disposed on the interlayer insulating layer ILD. The first capacitor electrode CE1 is one of the electrodes which form the first capacitor C1 and can be disposed to overlap with the first gate electrode GE1.

Next, FIGS. 4B to 4E are example plan views of the second driving transistor DT2 having various ratios of the width/length of the channel. Hereinafter, for the convenience of description, the second driving transistors DT2 of FIGS. 4B to 4E are referred to as a 2-1-th driving transistor DT2$a$, a 2-2-th driving transistor DT2$b$, a 2-3-th driving transistor DT2$c$, and a 2-4-th driving transistor DT2$d$, respectively.

Figure 4B:
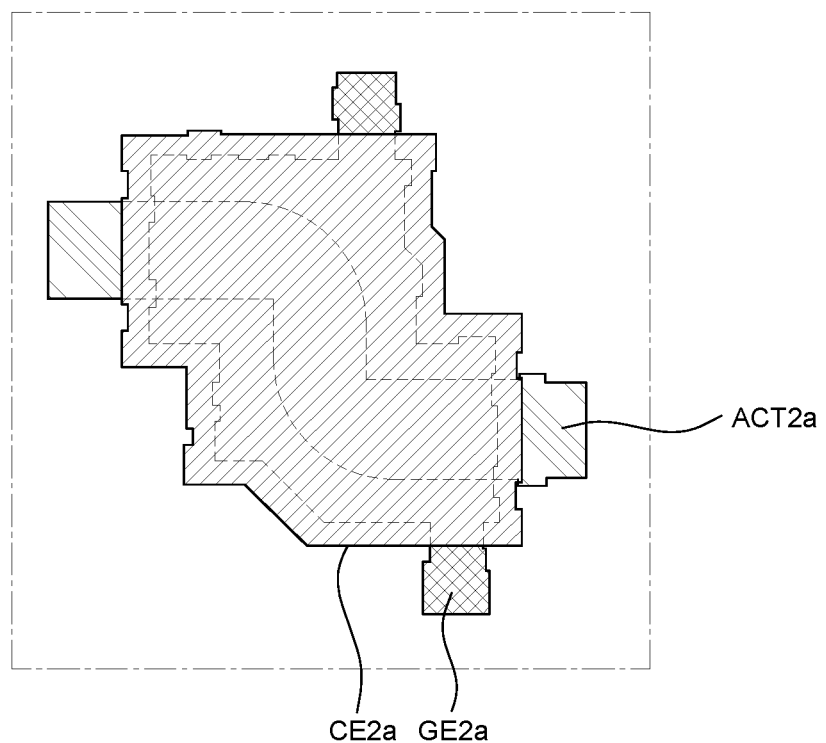
FIGS. 4B to 4E are plan views of a second driving transistor of a display device according to various example embodiments of the present disclosure.

FIG. 4B is a view illustrating the 2-1-th driving transistor DT2$a$ having the same ratio of width/length as the first driving transistor DT1 (e.g., a ratio of 4.5 to 21). The 2-1-th driving transistor DT2$a$ includes a 2-1-th active layer ACT2$a$ and a 2-1-th gate electrode GE2$a$ and a 2-1-th capacitor electrode CE2$a$ is disposed on the 2-1-th gate electrode GE2$a$. A channel of the 2-1-th driving transistor DT2$a$ has a ratio of width/length of 4.5/21 (e.g., a ratio of 4.5 to 21).

The 2-1-th active layer ACT2$a$ is disposed on the substrate 110. The 2-1-th active layer ACT2$a$ can be formed of a semiconductor material, such as an oxide semiconductor, amorphous silicon, or polysilicon, but is not limited thereto.

The gate insulating layer GI is disposed on the 2-1-th active layer ACT2$a$ and the 2-1-th gate electrode GE2$a$ is disposed on the gate insulating layer GI. The 2-1-th gate electrode GE2$a$ can be configured by a conductive material such as copper (Cu), aluminum (Al), molybdenum (Mo), nickel (Ni), titanium (Ti), chrome (Cr), or an alloy thereof, but is not limited thereto.

The interlayer insulating layer ILD is disposed on the 2-1-th gate electrode GE2$a$ and the 2-1-th capacitor electrode CE2$a$ is disposed on the interlayer insulating layer ILD. The 2-1-th capacitor electrode CE2$a$ is one of the electrodes which form the second capacitor C2 and can be disposed to overlap with the 2-1-th gate electrode GE2$a$.

Figure 4C:
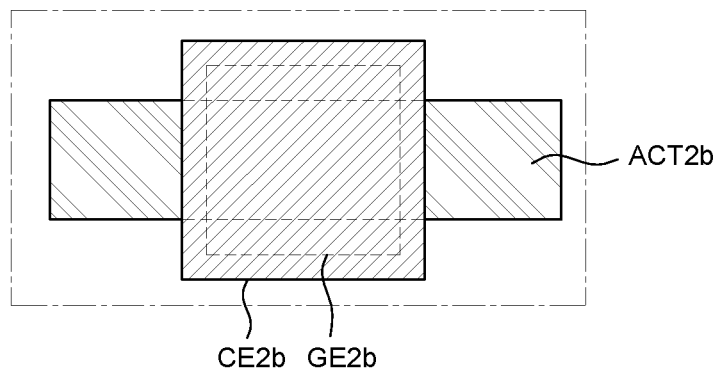

The 2-2-th driving transistor DT2$b$ illustrated in FIG. 4C is substantially the same as the 2-1-th driving transistor DT2$a$ except that the ratio of the width/length of the channel is different. The 2-2-th driving transistor DT2$b$ includes a 2-2-th active layer ACT2$b$ and a 2-2-th gate electrode GE2$b$ and a 2-2-th capacitor electrode CE2$b$ is disposed on the 2-2-th gate electrode GE2$b$. A channel of the 2-2-th driving transistor DT2$b$ has a ratio of width/length of 4.5/10 (e.g., a ratio of 4.5 to 10).

Figure 4D:
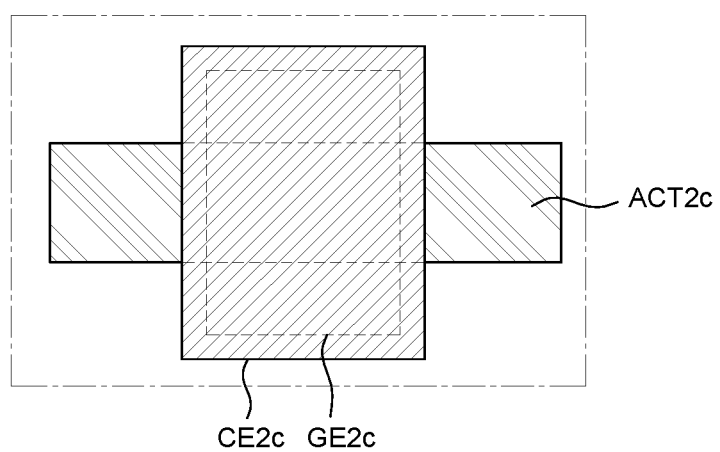

The 2-3-th driving transistor DT2$c$ illustrated in FIG. 4D is substantially the same as the 2-1-th driving transistor DT2$a$ except that the ratio of the width/length of the channel is different. The 2-3-th driving transistor DT2$c$ includes a 2-3-th active layer ACT2$c$ and a 2-3-th gate electrode GE2$c$ and a 2-3-th capacitor electrode CE2$c$ is disposed on the 2-3-th gate electrode GE2$c$. A channel of the 2-3-th driving transistor DT2$c$ has a ratio of width/length of 4.5/7 (e.g., a ratio of 4.5 to 7).

Figure 4E:
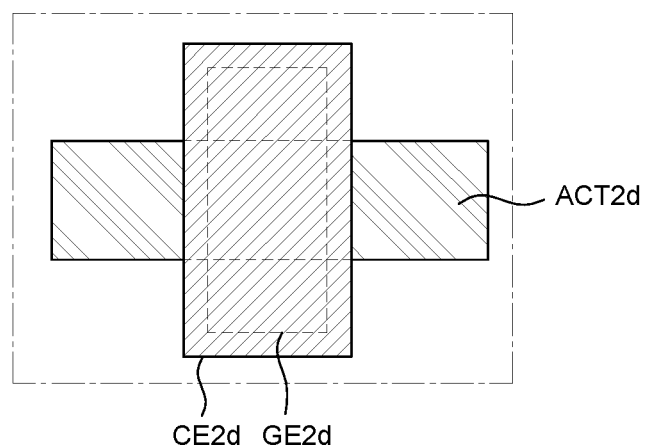

The 2-4-th driving transistor DT2$d$ illustrated in FIG. 4E is substantially the same as the 2-1-th driving transistor DT2$a$ except that the ratio of the width/length of the channel is different. The 2-4-th driving transistor DT2$d$ includes a 2-4-th active layer ACT2$d$ and a 2-4-th gate electrode GE2$d$ and a 2-4-th capacitor electrode CE2$d$ is disposed on the 2-4-th gate electrode GE2$d$. A channel of the 2-4-th driving transistor DT2$d$ has a ratio of width/length of 4.5/5 (e.g., a ratio of 4.5 to 5). For example, in each of the embodiments of FIGS. 4B to 4E the ratio of the width of the channel of the second driving transistor DT2 to the length of the channel the second driving transistor DT2 keeps getting larger, and as shown in FIG. 6, more current is provided as the ratio becomes larger.

Referring to FIG. 6, during the normal mode driving, only the first driving transistor DT1 illustrated in FIG. 4A can be driven. Only the first driver PD1, between the first driver PD1 and the second driver PD2 is driven so that it is confirmed that the first driving current Ia supplied from the first driver PD1 to the light emitting diode EL is approximately 40 nA.

Next, during the high luminance mode driving, the first driving transistor DT1 of FIG. 4A and any one of the second driving transistors DT2 of FIGS. 4B to 4E can be driven together. For example, when the first driving transistor DT1 of FIG. 4A and the 2-1-th driving transistor DT2$a$ of FIG. 4B are driven together, a driving current supplied to the anode of the light emitting diode EL is approximately 80 nA (e.g., the current is doubled). Each of the first driving transistor DT1 and the second driving transistor DT2 having the same ratio of width/length can supply the first driving current Ia and the second driving current Ib which are substantially the same, to the light emitting diode EL. Therefore, the overall driving current supplied to the light emitting diode EL can be increased by approximately two times the driving current in the normal mode.

Next, when the first driving transistor DT1 and the 2-2-th driving transistor DT2$b$ of FIG. 4C are driven together, a driving current supplied to the anode of the light emitting diode EL is approximately 100 nA. As compared with the 2-1-th driving transistor DT2$a$, the ratio of width/length of the 2-2-th driving transistor DT2$b$ is 4.5/10 so that the length of the channel of the 2-2-th driving transistor DT2$b$ can be shorter. In this situation, the length of the channel of the 2-2-th driving transistor DT2$b$ is reduced so that the overall resistance of the channel is reduced and a higher second driving current Ib can flow through the 2-2-th driving transistor DT2$b$. Therefore, the overall driving current to be supplied to the anode is increased to be driven in the high luminance mode.

When the first driving transistor DT1 and the 2-3-th driving transistor DT2$c$ of FIG. 4D are driven together, a driving current supplied to the anode of the light emitting diode EL is approximately 200 nA. The ratio of width/length of the 2-3-th driving transistor DT2$c$ is 4.5/7 so that it can be shorter than the length of the channel of the 2-1-th driving transistor DT2*a* and the 2-2-th driving transistor DT2*b*. Therefore, the resistance of the channel of the 2-3-th driving transistor DT2*c* is reduced even more so that the second driving current Ib which flows through the 2-3-th driving transistor DT2*c* can be also increased even more. Accordingly, the overall driving current supplied to the anode, that is, a sum of the first driving current Ia and the second driving current Ib is increased to display an image with a higher luminance.

Finally, when the first driving transistor DT1 and the 2-4-th driving transistor DT2*d* of FIG. 4E are driven together, a driving current supplied to the anode of the light emitting diode EL is approximately 240 nA. The ratio of width/length of the 2-4-th driving transistor DT2*d* of FIG. 4E is 4.5/5, so that the channel has the shortest length as compared with the 2-1-th driving transistor DT2*a*, the 2-2-th driving transistor DT2*b*, and the 2-3-th driving transistor DT2*c*. The resistance of the channel of the 2-4-th driving transistor DT2*d* is the most significantly reduced so that the second driving current Ib which flows through the 2-4-th driving transistor DT2*d* can be also increased the most. Accordingly, the overall driving current which is supplied to the anode is also increased the most to display an image with even higher luminance.

Accordingly, as confirmed from the simulation result of FIG. 6, it is confirmed that as the width/length value of the channel of the second driving transistor DT2 is increased, the overall driving current supplied to the light emitting diode EL is increased. Therefore, a level of the high luminance mode can be controlled or adjusted by controlling the ratio of width/length of the second driving transistor DT2 to have a specific configuration with specific dimensions, in order to optimize the amount of current provided to the light emitting diode EL.

In the meantime, in order to implement the high luminance using only with the first driving transistor, the gate-source voltage Vgs of the first driving transistor is increased or a value of the width/length of the channel of the first driving transistor is increased. However, when the gate-source voltage Vgs of the first driving transistor is increased, a higher high potential power voltage should be used or an output range of the data voltage Vdata should be increased. For example, a higher data voltage Vdata is applied to increase the gate-source voltage Vgs and the driving current. However, when the output range of the data voltage Vdata is increased, a margin other than the output range of the data voltage Vdata is reduced in the voltage range which can be output from the driving IC and the manufacturing cost of the driving IC can increase. Further, when the width/length value is increased by increasing a width of the channel of the first driving transistor or reducing the length of the channel of the first driving transistor, even though the first driving current is increased, an image displayed in the low grayscale range cannot be delicately controlled so that the image quality can become degraded. For example, dark images or dark scenes can appear washed out or too bright.

Therefore, in the display device 100 according to the example embodiment of the present disclosure, the high luminance image can be displayed using the second driving transistor DT2 and the low grayscale image can be displayed using the first driving transistor DT1. For example, the low grayscale level can be deliberately and precisely expressed in a normal mode by controlling the width/length ratio of the first driving transistor DT1 (e.g., in order to provide true black, and purer dark images). When the width/length value is reduced by reducing the width of the channel of the first driving transistor DT1 or increasing the length of the channel of the first driving transistor DT1, the variance of the first driving current Ia is reduced in accordance with the change in the voltage applied to the first gate electrode GE1. Accordingly, the first driving current Ia which is reduced and finely controlled can be supplied to the light emitting diode EL. For example, the length of the channel of the first driving transistor DT1 is formed to be longer than the length of the channel of the second driving transistor DT2 to be advantageous for low grayscale expression. However, in order to design the length of the channel to be longer for the low grayscale expression, the restriction in the design is significant due to the limited area, and the like. At this time, only the first driving transistor DT1 is designed in consideration of the low grayscale expression and the second driving transistor DT2 which is driven only in the high luminance mode is regardless of the low grayscale expression so that the restrictions in the design are small. In other words, the first driving transistor DT1 can be configured to provide precise color or luminance ranges, while the second driving transistor DT2 can be selectively activated when high luminance is desired.

Further, in the display device 100 according to the example embodiment of the present disclosure, a high second driving current Ib can be generated by increasing a width of the channel of the second driving transistor DT2 or reducing the length to increase the width/length ratio value. Therefore, a higher driving current can be supplied to the light emitting diode EL without increasing the gate-source voltage Vgs of the second driving transistor DT2 by applying a higher data voltage Vdata. Therefore, the output range of the data voltage Vdata can be reduced by connecting the first driving transistor DT1 and the second driving transistor DT2 in parallel. In this situation, a section of a voltage range, which can be output from the driving IC, occupied by the output range of the data voltage Vdata is reduced so that the remaining section can be ensured as a margin and a voltage in the remaining section can be used as a compensation voltage.

Hereinafter, an output range of a data voltage Vdata in a high luminance mode and an output range of a data voltage when a low grayscale image is displayed in the normal mode will be described with reference to FIGS. 7 to 9.

Figure 7:
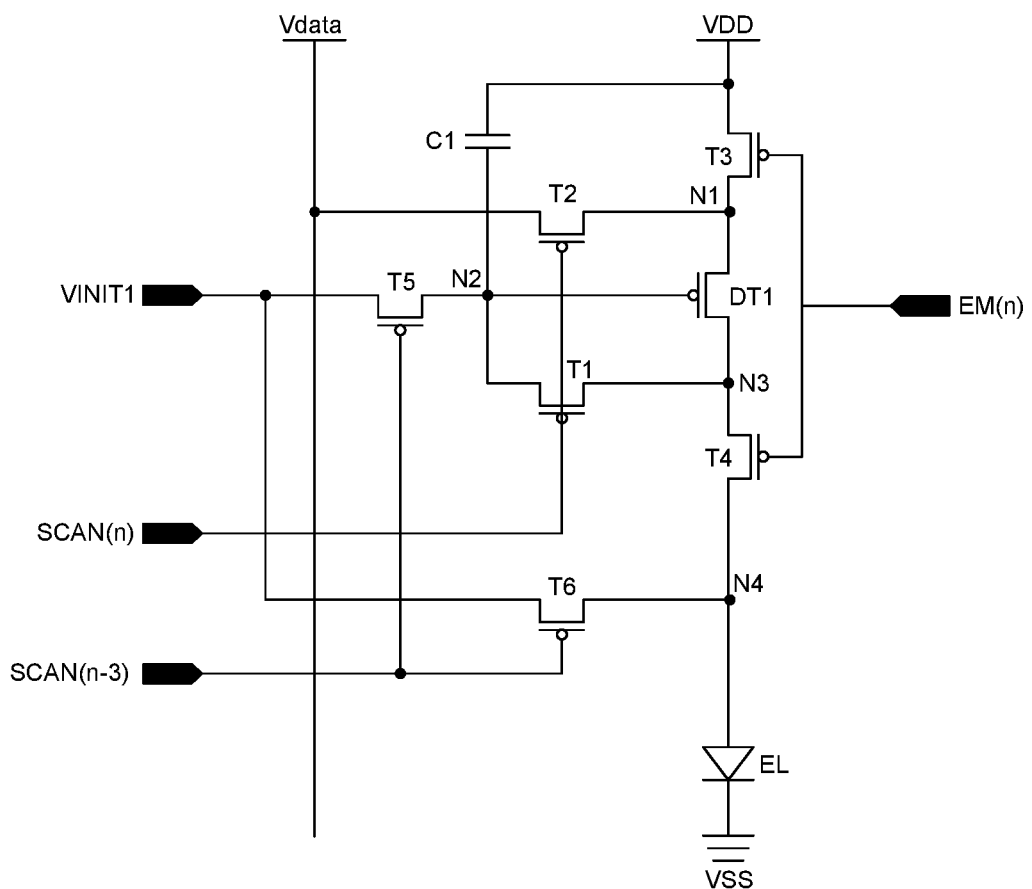
FIG. 7 is a circuit diagram of a sub pixel of a display device according to a comparative embodiment of the present disclosure.

FIG. 7 is a circuit diagram of a sub pixel of a display device according to a comparative embodiment. FIG. 8 is a simulation result of measuring an output range of a data voltage of a display device according to a comparative embodiment and an example embodiment in a high luminance image. FIG. 9 is a simulation result of measuring an output range of a data voltage of a display device according to a comparative embodiment and an example embodiment in a low grayscale image.

Referring to FIG. 7, a sub pixel SP of a display device 10 according to a comparative embodiment does not include the second driver PD2, but include only includes the first driver PD1 and the light emitting diode EL, as compared with the display device 100 according to the example embodiment of the present disclosure. The sub pixel SP of the display device 10 of the comparative embodiment includes only a first driver PD1 including a first transistor T1, a second transistor T2, a third transistor T3, a fourth transistor T4, a fifth transistor T5, a sixth transistor T6, a first driving transistor DT1, and a first capacitor C1 and a light emitting diode EL.

Figure 8:
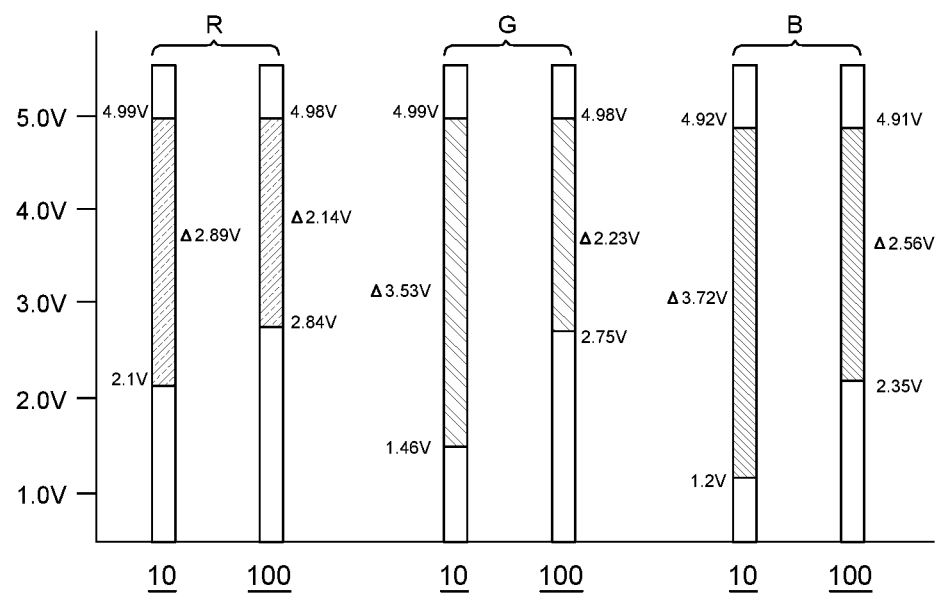
FIG. 8 is a simulation result of measuring an output range of a data voltage of a display device according to a comparative embodiment of the present disclosure and an example embodiment of the present disclosure in a high luminance image.
Figure 9:
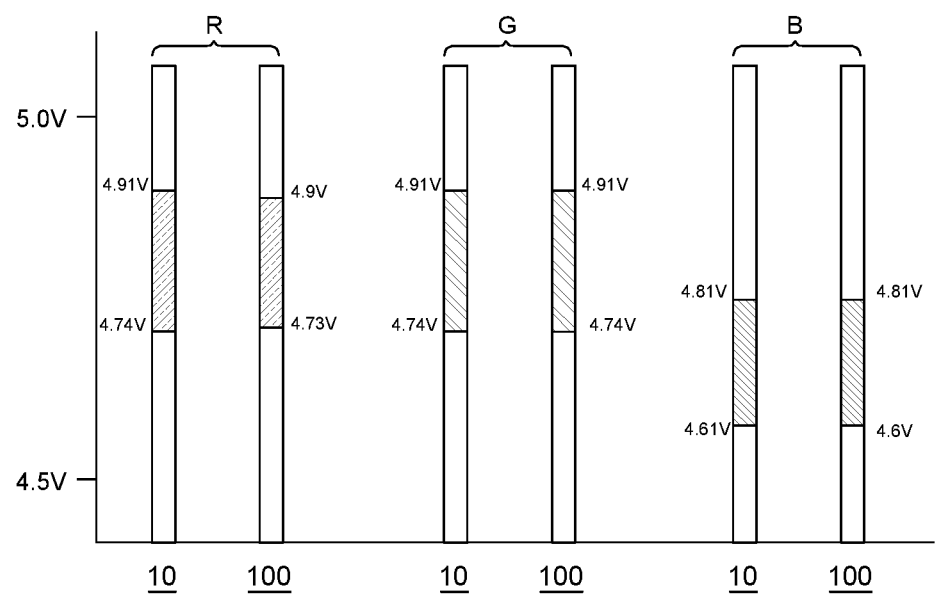
FIG. 9 is a simulation result of measuring an output range of a data voltage of a display device according to a comparative embodiment of the present disclosure and an example embodiment of the present disclosure in a low grayscale image.

The simulations of FIGS. 8 and 9 measure the output range of the data voltage Vdata. For the simulations, a width/length ratio of the channel of the first driving transistor DT1 of the comparative embodiment and the example embodiment of the present disclosure is set to 3/24 (e.g., a ratio of 3 to 24), a width/length ratio of the channel of the second driving transistor DT2 of the example embodiment of the present disclosure is set to 4.5/10 (e.g., a ratio of 4.5 to 10). Further, the high potential power voltage VDD is set to 5 V, the low potential power voltage VSS is set to −3 V, the first initialization voltage VINIT1 is set to −3.5 V. Further, a first voltage V1 of the second initialization voltage VINIT2 which is output in the normal mode is set to 5 V and a second voltage V2 of the second initialization voltage VINIT2 which is output in the high luminance mode is set to −3.5 V.

Referring to FIG. 8, when a red image R, a green image G, and a blue image B of 1 to 255 grayscale levels are displayed, respectively, with a luminance of 4000 nit as a target, a result of measuring an output range of the data voltage Vdata is illustrated. At this time, the display device 100 according to the example embodiment of the present disclosure is driven in the high luminance mode in which both the first driver PD1 and the second driver PD2 are driven.

First, the display device 10 according to the comparative embodiment can display 1 to 255 grayscale levels of red image R by outputting the data voltage Vdata of 2.1 V to 4.99 V, display 1 to 255 grayscale levels of green image G by outputting the data voltage Vdata of 1.46 V to 4.99 V, and display 1 to 255 grayscale levels of blue image B by outputting the data voltage Vdata of 1.2 V to 4.92 V. A variation of the data voltage Vdata of the red image R is 2.89 V, a variation of the data voltage Vdata of the green image G is 3.53 V, and a variation of the data voltage Vdata of the blue image B is 3.72 V. For example, the comparative embodiment needs a rather large variation of the data voltage Vdata in order to display 1 to 255 grayscale levels for the various colors, which leaves little room for any adjustments or compensation.

The display device 100 according to the example embodiment of the present disclosure can display 1 to 255 grayscale levels of red image R by outputting the data voltage Vdata of 2.84 V to 4.98 V, display 1 to 255 grayscale levels of green image G by outputting the data voltage Vdata of 2.75 V to 4.98 V, and display 1 to 255 grayscale levels of blue image B by outputting the data voltage Vdata of 2.35 V to 4.91 V. A variation of the data voltage Vdata of the red image R is 2.14 V, a variation of the data voltage Vdata of the green image G is 2.23 V, and a variation of the data voltage Vdata of the blue image B is 2.56 V. For example, the example embodiment can display 1 to 255 grayscale levels for the various colors with a much smaller variation in the data voltage Vdata, which leaves much more room for adjustment provides a lager voltage margin or buffer.

Accordingly, it is confirmed that the output range of the data voltage Vdata of the display device 10 according to the comparative embodiment is much larger than the output range of the data voltage Vdata of the display device 100 according to the example embodiment of the present disclosure. Specifically, the output range of the data voltage Vdata for outputting the green image G and the blue image B has a big difference of 1 V or higher.

The display device 10 according to the comparative embodiment includes only one first driving transistor DT1 so that the high luminance of 4000 nit can be implemented by increasing the gate-source voltage Vgs of the first driving transistor DT1. As described above, in order to increase the gate-source voltage Vgs, a higher potential power voltage VDD or high data voltage Vdata needs to be applied to the source electrode or the gate electrode of the first driving transistor DT1, that is, the first node N1 or the second node N2. Accordingly, in the display device 10 according to the comparative embodiment which displays the image only with the first driving current Ia generated in the first driver PD1, in order to implement a high luminance of 4000 nit, a higher data voltage Vdata is necessary and an overall output range of the data voltage Vdata is also increased. Therefore, it is difficult to ensure the voltage margin.

In contrast, the display device 100 according to the example embodiment of the present disclosure which displays the image with the first driving current Ia of the first driver PD1 and the second driving current Ib of the second driver PD2 can display a high luminance image without applying a higher data voltage Vdata. Accordingly, the display device 100 according to the example embodiment of the present disclosure can supply a higher driving current to the light emitting diode EL by connecting the first driving transistor DT1 and the second driving transistor DT2 in parallel. Accordingly, the output range of the data voltage Vdata can be reduced and the voltage margin can be ensured and better image quality can be provided while also consuming less power.

Next, referring to FIG. 9, when red, green, and blue images R, G, B of 15 to 31 grayscale levels, that is, in the low grayscale range, are displayed, respectively, with a luminance of 250 nit as a target, a result of measuring an output range of the data voltage Vdata is illustrated. At this time, the display device 100 according to the example embodiment of the present disclosure is driven in the normal mode in which only the first driver PD1 is driven.

The display device 10 according to the comparative embodiment can display 15 to 31 grayscale levels of red image R by outputting the data voltage Vdata of 4.74 V to 4.91 V, display 15 to 31 grayscale levels of green image G by outputting the data voltage Vdata of 4.74 V to 4.91 V, and display 15 to 31 grayscale levels of blue image B by outputting the data voltage Vdata of 4.61 V to 4.81 V.

The display device 100 according to the example embodiment of the present disclosure can display 15 to 31 grayscale levels of red image R by outputting the data voltage Vdata of 4.73 V to 4.9 V, display 15 to 31 grayscale levels of green image G by outputting the data voltage Vdata of 4.74 V to 4.91 V, and display 15 to 31 grayscale levels of blue image B by outputting the data voltage Vdata of 4.6 V to 4.81 V.

Accordingly, it is confirmed that when a low luminance and low grayscale image is displayed, the output range of the data voltage Vdata of the display device 10 according to the comparative embodiment and the output range of the data voltage Vdata of the display device 100 according to the example embodiment of the present disclosure are similar. The first driving transistor DT1 of the comparative embodiment and the first driving transistor DT1 of the present disclosure has the same width/length ratio of channel of 3/24 (e.g., a ratio 3 to 24) so that the output ranges of the data voltage Vdata in the low-grayscale range are also substantially the same.

Even though the display device 100 according to the example embodiment further includes the second driving transistor DT2, the second driving transistor DT2 is driven only in the high luminance mode to easily display the low luminance and low grayscale image regardless of the second driving transistor DT2.

Therefore, in the display device 100 according to the example embodiment of the present disclosure, in one sub pixel SP, the first driver PD1 and the second driver PD2 are disposed and the second driver PD2 can be selectively driven according to a characteristic of an image to be displayed. In the normal mode in which a high luminance is not necessary, only the first driving transistor DT1 is driven to display the image. At this time, a width/length ratio of the channel of the first driving transistor DT1 is controlled to precisely and delicately display the low grayscale image. Further, in the high luminance mode, both the first driving transistor DT1 and the second driving transistor DT2 are driven to display a high luminance image. Both the first driving current Ia from the first driving transistor DT1 and the second driving current Ib from the second driving transistor DT2 are supplied to the light emitting diode EL to display the high luminance image. Accordingly, the high luminance image can be easily displayed without increasing the output range of the data voltage Vdata.

The example embodiments of the present disclosure can also be described as follows:

According to an aspect of the present disclosure, there is provided a display device. The display device which is driven in any one of a normal mode in which an image in a luminance range which is equal to or lower than a predetermined luminance is displayed and a high luminance mode in which an image in a luminance range higher than the predetermined luminance, the display device includes a substrate in which a plurality of sub pixels is disposed, a first driver which is disposed in each of the plurality of sub pixels and is configured to generate a first driving current, a second driver which is disposed in each of the plurality of sub pixels and is configured to generate a second driving current, and a light emitting diode which is supplied with the first driving current and the second driving current. In the normal mode, the first driving current is supplied to the light emitting diode and in the high luminance mode, the first driving current and the second driving current are supplied to the light emitting diode together.

During the normal mode driving, the first driver can be turned on and the second driver can be turned off and during the high luminance mode driving, the first driver and the second driver can be turned on.

The first driver can include a first driving transistor having a source electrode connected to a first node, a gate electrode connected to a second node, and a drain electrode connected to a third node, and the second driver includes a second driving transistor which is connected to the first driving transistor in parallel.

The first driver can further include a first transistor connected between the second node and the third node, a second transistor connected between the first node and a data line, a third transistor connected between the first node and a high potential power line, a fourth transistor connected between a fourth node which is an anode of the light emitting diode and the third node, a fifth transistor connected between the second node and a first initialization line, a sixth transistor connected between the fourth node and the first initialization line, and a first capacitor connected between the second node and the high potential power line.

A gate electrode of the second driving transistor can be connected to a fifth node, a source electrode can be connected to the first node, and a drain electrode can be connected to a sixth node. The second driver can further include a seventh transistor connected between the fifth node and the sixth node, an eighth transistor connected between the sixth node and the fourth node, a ninth transistor connected between the fifth node and the second initialization line, and a second capacitor connected between the fifth node and the high potential power line.

The display device can further include an emission control line connected to a gate electrode of the fourth transistor and a gate electrode of the eighth transistor, a n-th scan line connected to a gate electrode of the first transistor and a gate electrode of the seventh transistor, and a n−3-th scan line connected to a gate electrode of the fifth transistor and a gate electrode of the ninth transistor.

During the normal mode driving, a first initialization voltage can be output from the first initialization line and a first voltage can be output from the second initialization line, and the first voltage can be the same voltage as a high potential power voltage of the high potential power line.

During the normal mode driving, a turn-off level of voltage can be applied to the gate electrode of the second driving transistor.

During the high luminance mode driving, the first initialization voltage can be output from the first initialization line and a second voltage can be output from the second initialization line, and the second voltage can be the same voltage as the first initialization voltage.

A channel of the first driving transistor and a channel of the second driving transistor can have the same width/length ratio.

A length of a channel of the first driving transistor can be longer than a length of a channel of the second driving transistor.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

What is claimed is:

1. A display device comprising:
a plurality of sub pixels disposed on a substrate;
a first driver disposed in each of the plurality of sub pixels, the first driver being configured to generate a first driving current for a normal mode in which an image is displayed in a luminance range equal to or lower than a predetermined luminance;
a second driver disposed in each of the plurality of sub pixels, the second driver being configured to generate a second driving current for a high luminance mode in which the luminance range is higher than the predetermined luminance; and
a light emitting diode configured to:
receive the first driving current in the normal mode, and
receive a sum of the first driving current and the second driving current in the high luminance mode,
wherein the first driver includes:
a first driving transistor having a source electrode connected to a first node, a gate electrode connected to a second node, and a drain electrode connected to a third node;
a first transistor connected between the second node and the third node;
a second transistor connected between the first node and a data line;
a third transistor connected between the first node and a high potential power line;

a fourth transistor connected between the third node and a fourth node, the fourth node being an anode of the light emitting diode;
a fifth transistor connected between the second node and a first initialization line;
a sixth transistor connected between the fourth node and the first initialization line; and
a first capacitor connected between the second node and the high potential power line, and
wherein the second driver includes a second driving transistor which is connected to the first driving transistor in parallel.

2. The display device according to claim 1, wherein during the normal mode, the first driver is turned on and the second driver is turned off, and
wherein during the high luminance mode, the first driver and the second driver are both turned on.

3. The display device according to claim 1, wherein the second driving transistor includes a gate electrode connected to a fifth node, a source electrode connected to the first node, and a drain electrode connected to a sixth node, and
wherein the second driver further includes:
a seventh transistor connected between the fifth node and the sixth node;
an eighth transistor connected between the sixth node and the fourth node;
a ninth transistor connected between the fifth node and the second initialization line; and
a second capacitor connected between the fifth node and the high potential power line.

4. The display device according to claim 3, further comprising:
an emission control line connected to a gate electrode of the fourth transistor and a gate electrode of the eighth transistor;
a n-th scan line connected to a gate electrode of the first transistor and a gate electrode of the seventh transistor; and
a n-3-th scan line connected to a gate electrode of the fifth transistor and a gate electrode of the ninth transistor.

5. The display device according to claim 4, wherein the gate electrode of the third transistor, the gate electrode of the fourth transistor and the gate electrode of the eight transistor are all connected to the emission control line.

6. The display device according to claim 3, wherein during the normal mode driving, a first initialization voltage is output from the first initialization line and a first voltage is output from the second initialization line, and
wherein the first voltage has a same voltage as a high potential power voltage of the high potential power line.

7. The display device according to claim 6, wherein during the high luminance mode, the first initialization voltage is output from the first initialization line and a second voltage is output from the second initialization line, and
wherein the second voltage has a same voltage as the first initialization voltage.

8. The display device according to claim 3, wherein during the normal mode, a turn-off level voltage is applied to the gate electrode of the second driving transistor.

9. The display device according to claim 3, wherein the first and second driving transistors and the first through ninth transistors are p-type transistors.

10. The display device according to claim 1, wherein a first ratio of a width of a channel of the first driving transistor to a length of the channel of the first driving transistor is approximately equal to a second ratio of a width of a channel of the second driving transistor to a length of the channel of the second driving transistor.

11. The display device according to claim 1, wherein a first length of a channel of the first driving transistor is longer than a second length of a channel of the second driving transistor.

12. The display device according to claim 1, wherein a first ratio of a width of a channel of the first driving transistor to a length of the channel of the first driving transistor is smaller than a second ratio of a width of a channel of the second driving transistor to a length of the channel of the second driving transistor.

13. The display device according to claim 1, wherein each of a first active layer of the first driving transistor and a second active layer of the second driving transistor includes an oxide semiconductor material.

14. A method of controlling a display device, the method comprising:
displaying an image on a display panel including a plurality of subpixels, each of the plurality of subpixels including a first driver to supply a first current and a second driver to supply a second current;
in response to an ambient level of light around the display device being less than a predetermined light level, activating the first driver in each of the plurality of subpixels and supplying the first current to the plurality of subpixels via the corresponding first driver while the second driver is deactivated; and
in response to the ambient level of light around the display device being greater than a predetermined light level, activating both of the first driver and the second driver in each of the plurality of subpixels and supplying a sum of the first current and the second current to the plurality of subpixels via the corresponding first driver and the corresponding second driver,
wherein the first driver includes:
a first driving transistor having a source electrode connected to a first node, a gate electrode connected to a second node, and a drain electrode connected to a third node;
a first transistor connected between the second node and the third node;
a second transistor connected between the first node and a data line;
a third transistor connected between the first node and a high potential power line;
a fourth transistor connected between the third node and a fourth node, the fourth node being an anode of the light emitting diode;
a fifth transistor connected between the second node and a first initialization line;
a sixth transistor connected between the fourth node and the first initialization line; and
a first capacitor connected between the second node and the high potential power line, and
wherein the second driver includes a second driving transistor which is connected to the first driving transistor in parallel.

15. The method of claim 14, wherein a first ratio of a width of a channel of the first driving transistor to a length of the channel of the first driving transistor is approximately equal to a second ratio of a width of a channel of the second driving transistor to a length of the channel of the second driving transistor.

16. The method of claim 14, wherein a first ratio of a width of a channel of the first driving transistor to a length of the channel of the first driving transistor is smaller than a second ratio of a width of a channel of the second driving transistor to a length of the channel of the second driving transistor.

17. A subpixel circuit comprising:
   a light emitting diode configured to output light;
   a first driving transistor connected to the light emitting diode; and
   a second driving transistor connected to the light emitting diode,
   wherein the first driving transistor and the second driving transistor are connected in parallel and are configured to selectively provide a first driving current and a second driving current to the light emitting diode,
   wherein the first driving transistor includes a source electrode connected to a first node, a gate electrode connected to a second node, and a drain electrode connected to a third node, and
   wherein the subpixel circuit further includes:
      a first transistor connected between the second node and the third node;
      a second transistor connected between the first node and a data line;
      a third transistor connected between the first node and a high potential power line;
      a fourth transistor connected between the third node and a fourth node, the fourth node being an anode of the light emitting diode;
      a fifth transistor connected between the second node and a first initialization line;
      a sixth transistor connected between the fourth node and the first initialization line; and
      a first capacitor connected between the second node and the high potential power line.

18. The subpixel circuit according to claim 17, wherein the first driving transistor is configured to supply a first driving current to the light emitting diode during both of a normal mode and a high luminance mode, and
   wherein the second driving transistor is configured to remain deactivated during the normal mode, and supply a second driving current to the light emitting diode during the high luminance mode.

\* \* \* \* \*